United States Patent
Hashizume et al.

(10) Patent No.: US 11,245,013 B2
(45) Date of Patent: Feb. 8, 2022

(54) SILICON CARBIDE SEMICONDUCTOR DEVICE HAVING A STEP FILM FORMED BETWEEN A PLATING FILM AND A FIRST ELECTRODE

(71) Applicant: FUJI ELECTRIC CO., LTD., Kawasaki (JP)

(72) Inventors: Yuichi Hashizume, Matsumoto (JP); Keishirou Kumada, Matsumoto (JP); Yasuyuki Hoshi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/050,401

(22) Filed: Jul. 31, 2018

(65) Prior Publication Data
US 2019/0074359 A1  Mar. 7, 2019

(30) Foreign Application Priority Data
Sep. 5, 2017 (JP) .............................. JP2017-170679

(51) Int. Cl.
*H01L 29/16* (2006.01)
*H01L 29/66* (2006.01)
(Continued)

(52) U.S. Cl.
CPC .... *H01L 29/1608* (2013.01); *H01L 21/02172* (2013.01); *H01L 21/02529* (2013.01);
(Continued)

(58) Field of Classification Search
CPC ............. H01L 29/1608; H01L 29/6606; H01L 23/5329
See application file for complete search history.

(56) References Cited

U.S. PATENT DOCUMENTS

2001/0025984 A1* 10/2001 Osawa ................ H01L 29/0634
257/330
2009/0096020 A1* 4/2009 Yamanobe .......... H01L 29/0619
257/337
(Continued)

FOREIGN PATENT DOCUMENTS

JP  2005-347300  12/2005
JP  2006-100530   4/2006
(Continued)

OTHER PUBLICATIONS

Japanese Office Action from Japan Patent Application No. 2017-170679, dated Jun. 22, 2021 (13 pages including translation).

*Primary Examiner* — Anh D Mai

(57) ABSTRACT

A silicon carbide semiconductor device includes a first semiconductor layer of a first conductivity type provided on a front surface of a semiconductor substrate of the first conductivity type; a second semiconductor layer of a second conductivity type; a first semiconductor region of the first conductivity type; and a gate electrode having a striped-shape and provided on a gate insulating film. The silicon carbide semiconductor device further includes a first electrode provided on a surface of the second semiconductor layer and the first semiconductor region; a step film provided on the first electrode; a plating film provided on the first electrode and the step film; and a solder on the plating film. The step film is provided on the first electrode on which the solder and the plating film are provided, the step film being provided so as to be embedded in grooves formed on the first electrode.

18 Claims, 13 Drawing Sheets

(51) Int. Cl.

| | |
|---|---|
| *H01L 29/10* | (2006.01) |
| *H01L 29/06* | (2006.01) |
| *H01L 29/78* | (2006.01) |
| *H01L 29/417* | (2006.01) |
| *H01L 21/02* | (2006.01) |
| *H01L 23/532* | (2006.01) |
| *H01L 23/00* | (2006.01) |
| *H01L 29/423* | (2006.01) |
| *H01L 29/739* | (2006.01) |

(52) U.S. Cl.
CPC .......... *H01L 23/5329* (2013.01); *H01L 24/16* (2013.01); *H01L 29/0623* (2013.01); *H01L 29/1095* (2013.01); *H01L 29/417* (2013.01); *H01L 29/41725* (2013.01); *H01L 29/4236* (2013.01); *H01L 29/66068* (2013.01); *H01L 29/7813* (2013.01); *H01L 24/05* (2013.01); *H01L 24/13* (2013.01); *H01L 29/0696* (2013.01); *H01L 29/7397* (2013.01); *H01L 2224/0401* (2013.01); *H01L 2224/051* (2013.01); *H01L 2224/056* (2013.01); *H01L 2224/05018* (2013.01); *H01L 2224/05027* (2013.01); *H01L 2224/05559* (2013.01); *H01L 2224/05572* (2013.01); *H01L 2224/13007* (2013.01); *H01L 2224/13023* (2013.01)

(56) References Cited

U.S. PATENT DOCUMENTS

| | | |
|---|---|---|
| 2010/0240213 A1 | 9/2010 | Urano et al. |
| 2016/0336402 A1 | 11/2016 | Onishi |
| 2017/0084699 A1* | 3/2017 | Hoshi ............... H01L 29/41741 |
| 2019/0393333 A1 | 12/2019 | Fujita et al. |

FOREIGN PATENT DOCUMENTS

| | | |
|---|---|---|
| JP | 2009-11188 | 1/2009 |
| JP | 2010-251719 A | 11/2010 |
| JP | 2012-199386 A | 10/2012 |
| JP | 2015-146399 | 8/2015 |
| JP | 2016-115735 A | 6/2016 |
| JP | 2017-59720 | 3/2017 |
| JP | 2017-143214 A | 8/2017 |
| WO | WO 2015/040712 A1 | 3/2015 |
| WO | 2018/167925 A1 | 9/2018 |

* cited by examiner

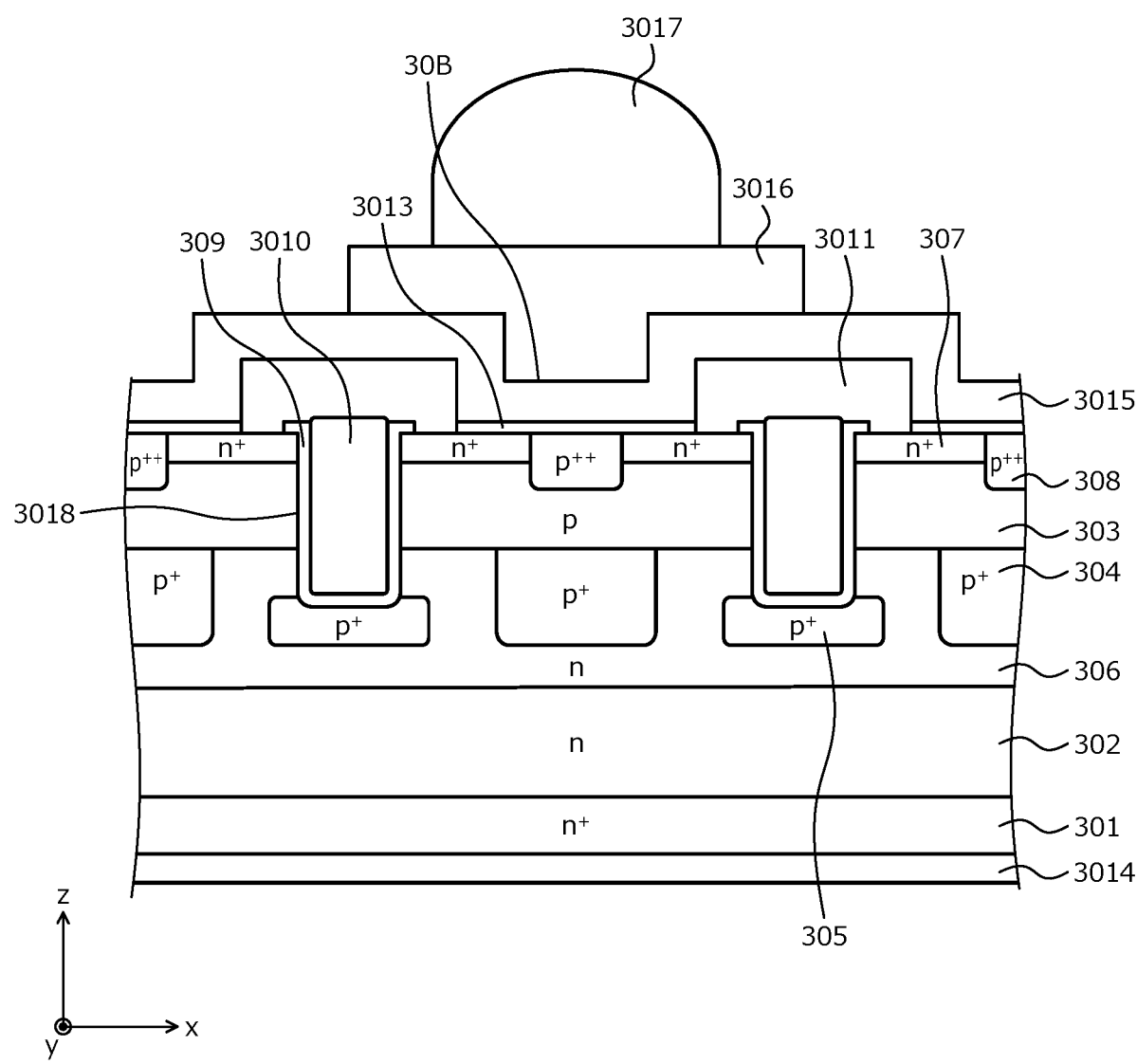

SILICON CARBIDE SEMICONDUCTOR DEVICE HAVING A STEP FILM FORMED BETWEEN A PLATING FILM AND A FIRST ELECTRODE

CROSS REFERENCE TO RELATED APPLICATIONS

This application is based upon and claims the benefit of priority of the prior Japanese Patent Application No. 2017-170679, filed on Sep. 5, 2017, the entire contents of which are incorporated herein by reference.

BACKGROUND

1. Field

Embodiments of the invention relate to a silicon carbide semiconductor device and a method of manufacturing a silicon carbide semiconductor device.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

Silicon carbide is chemically a very stable semiconductor material, has a wide bandgap of 3 eV, and can be used very stably as a semiconductor even at high temperatures. Silicon carbide has a critical electric field strength that is ten times that of silicon or greater, and is expected to be a semiconductor material that can sufficiently reduce ON-resistance. These merits of silicon carbide are common to other semiconductor materials having a bandgap greater than that of silicon such as gallium nitride (GaN). Thus, a high breakdown voltage of a semiconductor device can be facilitated by using a wide bandgap semiconductor material.

With such high-voltage semiconductor devices using silicon carbide, when used in an inverter, the extent to which occurring loss is reduced, the carrier frequency may be used for frequency applications 10 times higher than that of a conventional semiconductor device using silicon. Further, when a semiconductor device is used for a high frequency application, generated heat increases the chip temperature, affecting the reliability of the semiconductor device. In particular, a bonding wire is bonded to a front electrode on a substrate front surface side. The bonding wire is a wiring member to carry the potential of the front electrode to the outside and when the semiconductor device is used at high temperatures such 200 degrees C. or higher, adhesion of the front electrode and the bonding wire decreases, affecting reliability of the semiconductor device.

Since the silicon carbide semiconductor device is used at high temperatures of 230 degrees or higher, a pin-shaped electrode may be bonded to the front electrode by a solder, in place of the bonding wire. As a result, reduced adhesiveness between the front electrode and the pin-shaped electrode may be prevented. FIG. 17 is a cross-sectional view of a structure of a conventional silicon carbide semiconductor device. As depicted in FIG. 17, at a front surface (surface on a side having a p-type silicon carbide epitaxial layer 303) side of a semiconductor base (hereinafter, silicon carbide base) containing silicon carbide, a MOS gate having a general trench gate structure is provided. In the silicon carbide base (semiconductor chip), on an $n^+$-type supporting substrate (hereinafter, $n^+$-type silicon carbide substrate) 301 containing silicon carbide, an n-type silicon carbide epitaxial layer 302, an n-type high-concentration region 306 that is a current diffusion region, and silicon carbide layers that constitute a p-type silicon carbide epitaxial layer 303 are sequentially formed by epitaxial growth.

In the n-type high-concentration region 306, between (mesa part) adjacent trenches 3018, a first $p^+$-type base region 304 is selectively formed. Further, in the n-type high-concentration region 306, second $p^+$-type base regions 305 are selectively provided partially covering bottoms of the trenches 3018. The second $p^+$-type base regions 305 are provided at a depth so as to not reach the n-type silicon carbide epitaxial layer 302. The second $p^+$-type base regions 305 and the first $p^+$-type base regions 304 may be formed concurrently. The first $p^+$-type base regions 304 are provided so as to be in contact with the p-type silicon carbide epitaxial layer 303.

Reference numerals 307, 308, 309, 3010, 3011, 3013, and 3015 are an $n^+$-type source region, a $p^{++}$-type contact region, a gate insulating film, a gate electrode, an interlayer insulating film, a source electrode, and a source electrode pad, respectively. At a top of the source electrode pad 3015, a plating film 3016 is provided. A pin-shaped electrode (not depicted) connected to the plating film 3016 by a solder 3017 is provided. At a rear surface side of the $n^+$-type silicon carbide substrate 1, a rear electrode 3014 is provided.

Further, as a technique of realizing high tolerance under conditions involving heating or cooling, a semiconductor device is known that includes a surface electrode and a bonded layer partially formed on the surface electrode so that an end of the bonded layer is positioned on a region on the surface electrode (for example, refer to International Publication No. 2015/040712). Further, as a technique of suppressing destruction of an electrode part due to thermal stress, a semiconductor device is known in which the electrode part is configured by an Al electrode and an Ni plating layer, and a length from an uppermost part of an interlayer insulating film to a bottom of a recess part present at a surface of the Al electrode is 1.8 μm or more (for example, refer to Japanese Laid-Open Patent Publication No. 2005-347300). Further, as a technique of suppressing degradation of characteristics of a semiconductor device due to propagation of stress to the semiconductor material, a semiconductor device is known that includes an aluminum step film; a dividing insulating layer that divides a surface of the aluminum step film into plural regions; and a nickel layer that is formed on the surface of the aluminum step film and has a border where the crystal structure is discontinuous in an upper part of the dividing insulating layer (for example, refer to Japanese Laid-Open Patent Publication No. 2006-100530).

SUMMARY

According to an embodiment of the present invention, a silicon carbide semiconductor device includes a semiconductor substrate of a first conductivity type; a first semiconductor layer of the first conductivity type provided on a front surface of the semiconductor substrate and having an impurity concentration that is lower than an impurity concentration of the semiconductor substrate; a second semiconductor layer of a second conductivity type selectively provided on a surface of the first semiconductor layer on a first side of the first semiconductor layer, opposite a second side of the first semiconductor layer facing toward the semiconductor substrate; a first semiconductor region of the first conductivity type selectively provided in a surface layer of the second semiconductor layer on a first side of the second semiconductor layer, opposite a second side of the second semiconductor layer facing toward the semiconductor substrate; a gate electrode having a striped-shape and provided on the first side of the second semiconductor layer, via a gate insulating film; an interlayer insulating film that covers the gate electrode; a contact hole having a striped-shape and provided in the interlayer insulating film so as to expose the first semiconductor region and the second semiconductor layer; a first electrode provided on a surface of the first semiconductor region and the second semiconductor layer exposed in the contact hole; a plating film selectively provided on the first electrode; a solder on the plating film; and a second electrode provided on a rear surface of the semiconductor substrate. In a region in which the plating film is provided, a step film is provided on the first electrode in the contact hole.

In the embodiment, the step film is disposed in a layout having a hexagonal-shape in a plan view.

In the embodiment, the step film has a thickness ranging from 0.9 µm to 1.1 µm and a width that is at most 10 µm.

In the embodiment, the silicon carbide semiconductor device further includes a metal film sandwiched between the plating film and the first electrode and between the plating film and the step film.

In the embodiment, the step film is made of a metal.

In the embodiment, the step film is only disposed beneath the plating film.

In the embodiment, The silicon carbide semiconductor device further includes a trench penetrating the second semiconductor layer and reaching the first semiconductor layer. The gate electrode is provided in the trench, via the gate insulating film.

According to another embodiment of the present invention, a method of manufacturing a silicon carbide semiconductor device, includes forming a first semiconductor layer of a first conductivity type on a front surface of a semiconductor substrate of the first conductivity type, the first semiconductor layer having an impurity concentration that is lower than an impurity concentration of the semiconductor substrate; selectively forming a second semiconductor layer of a second conductivity type on a surface of the first semiconductor layer on a first side of the first semiconductor layer, opposite a second side of the first semiconductor layer facing toward the semiconductor substrate; selectively forming a first semiconductor region of the first conductivity type in a surface layer of the second semiconductor layer on a first side of the second semiconductor layer, opposite a second side of the second semiconductor layer facing toward the semiconductor substrate; forming a gate electrode having a striped-shape, the gate electrode being formed on the first side of the second semiconductor layer, via a gate insulating film; forming an interlayer insulating film that covers the gate electrode; forming a contact hole having a striped-shape, the contact hole being formed in the interlayer insulating film so as to expose the first semiconductor region and the second semiconductor layer; forming a first electrode on a surface of the first semiconductor region and the second semiconductor layer exposed in the contact hole; selectively forming a step film in a region where a plating film is to be formed, the step film is formed on the first electrode in the contact hole; selectively forming the plating film on the first electrode and the step film; disposing a solder on the plating film; and forming a second electrode on a rear surface of the semiconductor substrate.

In the embodiment, the method further includes forming a metal film that covers the first electrode and the step film, the metal film being formed after selectively forming the step film and before selectively forming the plating film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 17 is a cross-sectional view of a structure of a conventional silicon carbide semiconductor device;

DESCRIPTION OF EMBODIMENTS

First, problems associated with the prior arts will be discussed. In a case where the plating film 3016 and the solder 3017 are provided on the source electrode pad 3015 and the pin-shaped electrode is attached by the solder 3017 in order to improve thermal capability when a continuous test or the like is performed, the solder 3017 is pushed out by the stress of the pin-shaped electrode. On the other hand, in the conventional silicon carbide semiconductor device, since the step is present due to the interlayer insulating film 3011, a groove 30B is created at the surface of the source electrode pad 3015 provided on the surface of the interlayer insulating film 3011.

Figure 18A:
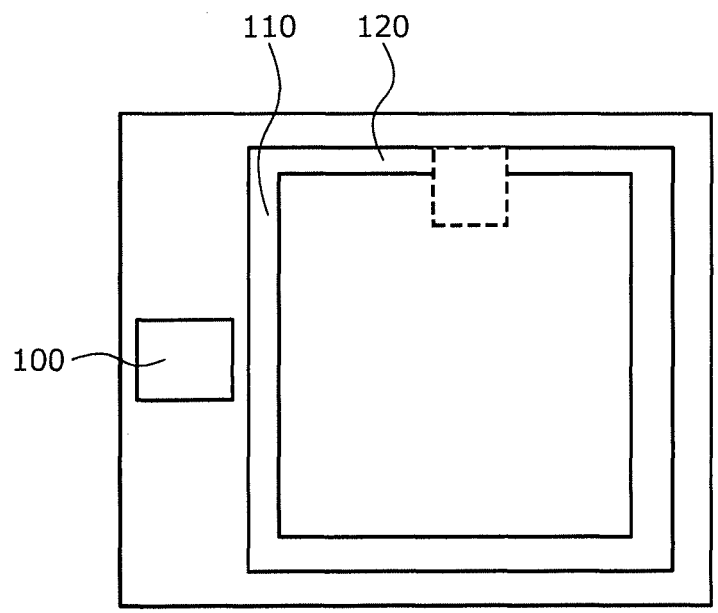
FIG. 18A is a top view of a structure of a part of the conventional silicon carbide semiconductor device.
Figure 18B:
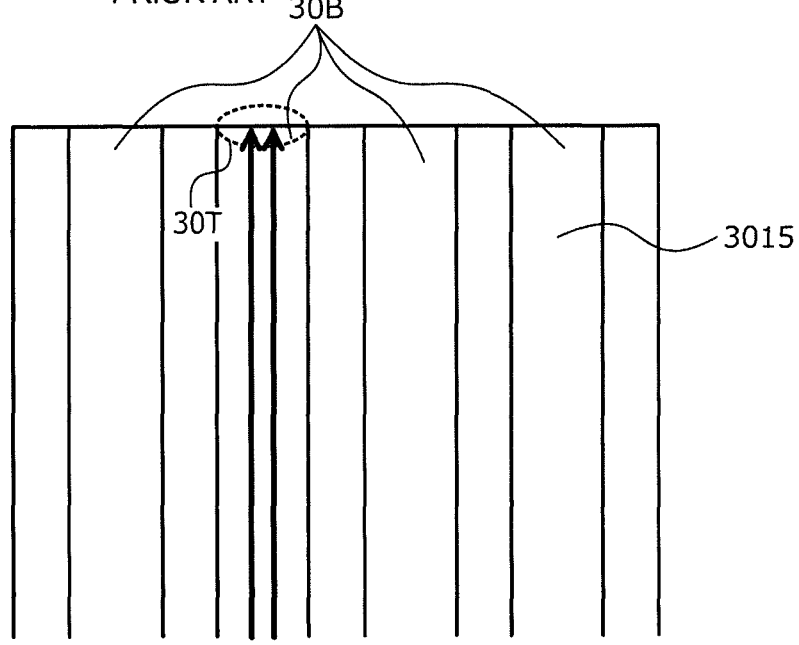
FIG. 18B is an enlarged view of a part encompassed by a dotted line in FIG. 18A.

FIGS. 18A and 18B are top views of a structure of a part of the conventional silicon carbide semiconductor device. As depicted in FIGS. 18A and 18B, the conventional silicon carbide semiconductor device includes a gate pad region 100, a source pad region 110, and a plating region 120. FIG. 18B is an enlarged view of a part encompassed by a dotted line in FIG. 18A. In the conventional silicon carbide semiconductor device, when the solder 3017 is pushed out by the stress of the pin-shaped electrode, the groove 30B in the surface of the source electrode pad 3015 is present and therefore, the solder 3017 proceeds along the groove 30B and is pushed into an end 30T of the groove 30B.

In the silicon carbide semiconductor device, while polyimide is provided on the source electrode 3013 as a protecting film (not depicted), the solder 3017 enters a space between the polyimide and the source electrode 3013 due to the stress of the pushed solder 3017. Here, while the source electrode 3013 is made of aluminum (Al), Al is not a barrier of the solder 3017 and therefore, the solder 3017 reaches the surface of the silicon carbide base and the characteristics of the silicon carbide semiconductor device degrade. Further, the solder 3017 enters the interlayer insulating film 3011, whereby the source electrode 3013 and the gate electrode 3010 may short, causing the silicon carbide semiconductor device fail.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −, and represents one example. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
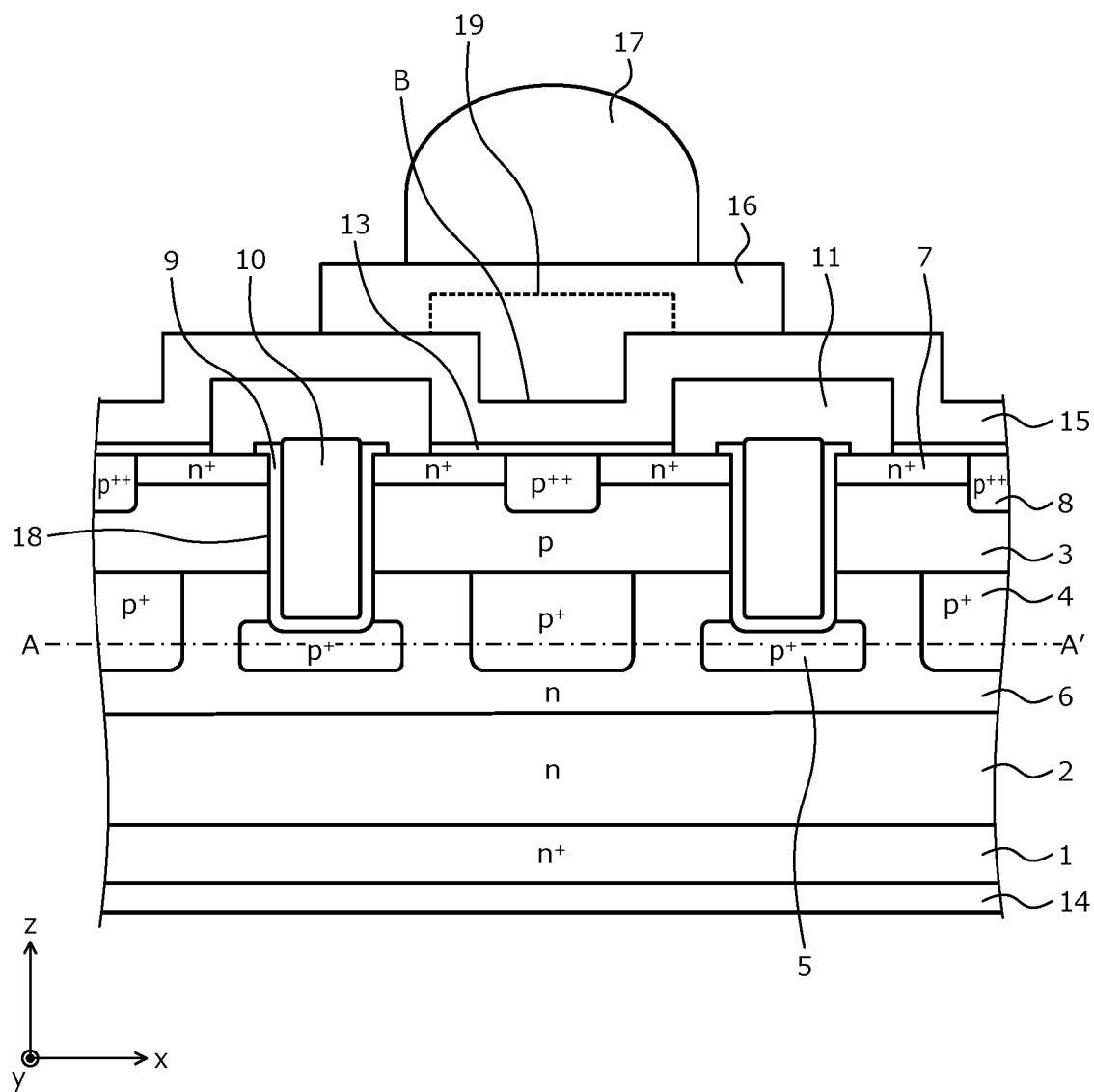
FIG. 1 is a cross-sectional view of a structure of a silicon carbide semiconductor device according to a first embodiment.

A semiconductor device according to the embodiments is formed using a wide bandgap semiconductor material. In a first embodiment, a silicon carbide semiconductor device fabricated using, for example, silicon carbide (SiC) as the wide bandgap semiconductor material will be described taking a MOSFET as an example. FIG. 1 is a cross-sectional view of a structure of the silicon carbide semiconductor device according to the first embodiment.

As depicted in FIG. 1, in the silicon carbide semiconductor device according to the first embodiment, on a first main surface (front surface), for example, a (0001) plant (Si face) of an $n^+$-type silicon carbide substrate (semiconductor substrate of a first conductivity type) 1, an n-type silicon carbide epitaxial layer (first semiconductor layer of the first conductivity type) 2 is deposited.

The $n^+$-type silicon carbide substrate 1 is, for example, a silicon carbide single crystal substrate doped with nitrogen (N). The n-type silicon carbide epitaxial layer 2 has an impurity concentration that is lower than an impurity concentration of the $n^+$-type silicon carbide substrate 1 and, for example, is a low-concentration n-type drift layer doped with nitrogen. At a surface of the n-type silicon carbide epitaxial layer 2 on a first side of the n-type silicon carbide epitaxial layer 2, opposite a second side of the n-type silicon carbide epitaxial layer 2 facing toward the $n^+$-type silicon carbide substrate 1, an n-type high-concentration region 6 is formed. The n-type high-concentration region 6 has an impurity concentration that is lower than the impurity concentration of the $n^+$-type silicon carbide substrate 1 and higher than the impurity concentration of the n-type silicon carbide epitaxial layer 2 and, for example, is a high-concentration n-type drift layer doped with nitrogen. Hereinafter, the $n^+$-type silicon carbide substrate 1, the n-type silicon carbide epitaxial layer 2, and a p-type silicon carbide epitaxial layer (second semiconductor layer of a second conductivity type) 3 described hereinafter combined are regarded as a silicon carbide semiconductor base.

As depicted in FIG. 1, on a second main surface (rear surface, i.e., rear surface of the silicon carbide semiconductor base) of the $n^+$-type silicon carbide substrate 1, a rear electrode 14 is provided. The rear electrode 14 constitutes a drain electrode. On a surface of the rear electrode 14, a drain electrode pad (not depicted) is provided.

At a first main surface side (side having the p-type silicon carbide epitaxial layer 3) of the silicon carbide semiconductor base, a trench structure having a striped-shape is formed. In particular, a trench 18 penetrates the p-type silicon carbide epitaxial layer 3, from a surface thereof on a first side (the first main surface side of the silicon carbide semiconductor base) of the p-type silicon carbide epitaxial layer 3, opposite a second side of the p-type silicon carbide epitaxial layer 3 facing toward the $n^+$-type silicon carbide substrate 1. The trench 18 reaches the n-type silicon carbide epitaxial layer 2. Along an inner wall of the trench 18, a gate insulating film 9 is formed on a bottom and side walls of the trench 18 and a gate electrode 10 having a striped-shaped is formed on the gate insulating film 9 in the trench 18. The gate electrode 10 is insulated from the n-type silicon carbide epitaxial layer 2 and the p-type silicon carbide epitaxial layer 3 by the gate insulating film 9. The gate electrode 10 may partially protrude from a top (side toward the source electrode pad 15) of the trench 18, toward the source electrode pad 15.

In a surface layer on the first side (the first main surface side of the silicon carbide semiconductor base) of the n-type silicon carbide epitaxial layer 2, a first $p^+$-type base region 4 and a second $p^+$-type base region 5 are selectively provided. The second $p^+$-type base region 5 is formed below the trench 18, and has a width that is wider than a width of the trench 18. The first $p^+$-type base region 4 and the second $p^+$-type base region 5 are doped with, for example, aluminum.

Figure 5:
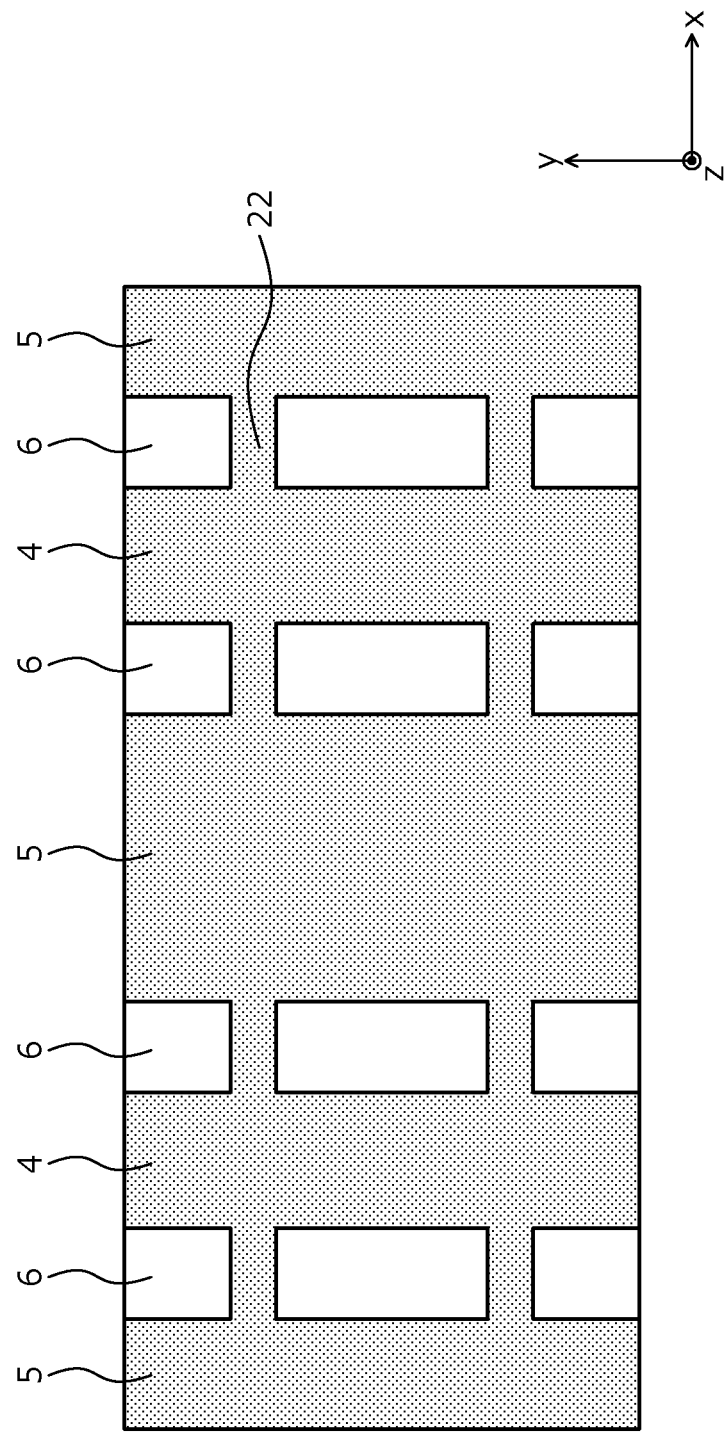
FIG. 5 is a cross-sectional view of a part of the silicon carbide semiconductor device according to the first embodiment along cutting line A-A' in FIG. 1.

The first $p^+$-type base region 4 may partially extend toward the trench 18 to have a structure continuous with the second $p^+$-type base region 5. In this case, an extended part of the first $p^+$-type base region 4 may have a planar layout in which the extended part is alternately disposed with the n-type high-concentration region 6 along a direction (hereinafter, second direction) y orthogonal to a direction (hereinafter, first direction) x along which the first $p^+$-type base region 4 and the second $p^+$-type base region 5 are alternately disposed. An example of a planar layout of the first and the second $p^+$-type base regions 4, 5 is depicted in FIG. 5. FIG. 5 is a cross-sectional view of a part of the silicon carbide semiconductor device according to the first embodiment along cutting line A-A' in FIG. 1.

FIG. 5 depicts a state in which the first and the second $p^+$-type base regions 4, 5 are connected by a part 22 of the first $p^+$-type base region 4 (hatched area). For example, as depicted in FIG. 5, a structure in which each of the part 22 of the first $p^+$-type base region 4 extends toward the trenches 18 adjacent thereto along the first direction x to be continuous with parts of the second $p^+$-type base regions 5 may be periodically disposed along the second direction y. A reason for this is that holes generated when avalanche breakdown occurs at a junction part of the second $p^+$-type base region 5 and the n-type silicon carbide epitaxial layer 2 are efficiently migrated to a source electrode 13, whereby load on the gate insulating film 9 is reduced, improving reliability.

On the first side of the n-type silicon carbide epitaxial layer 2, the p-type silicon carbide epitaxial layer 3 is provided. In the p-type silicon carbide epitaxial layer 3, at the first side thereof, an $n^+$-type source region (first semiconductor region of the first conductivity type) 7 and a $p^{++}$-type contact region 8 are selectively provided. The $n^+$-type source region 7 is in contact with the trench 18. Further, the $n^+$-type source region 7 and the $p^{++}$-type contact region 8 are in contact with each other. In a region of the n-type silicon carbide epitaxial layer 2 between each of the first $p^+$-type base region 4 and the second $p^+$-type base region 5 in the surface layer on the first side of the n-type silicon carbide epitaxial layer 2, and in a region of the n-type silicon carbide epitaxial layer 2 between the p-type silicon carbide epitaxial layer 3 and the second $p^+$-type base region 5, the n-type high-concentration region 6 is provided.

In FIG. 1, while only two trench MOS structures are depicted, further MOS gate (insulated gates constituted by a metal oxide film semiconductor) structures having a trench structure may be disposed in parallel.

An interlayer insulating film 11 is provided on the first main surface side of the silicon carbide semiconductor base entirely so as to cover the gate electrode 10 embedded in the trench 18. The source electrode 13 is in contact with the $n^+$-type source region 7 and the $p^{++}$-type contact region 8, via a contact hole 21 in the interlayer insulating film 11. The source electrode 13 is electrically insulated from the gate electrode 10 by the interlayer insulating film 11. On the source electrode 13, the source electrode pad 15 is provided. Between the source electrode 13 and the interlayer insulating film 11, for example, a barrier metal (not depicted) that prevents diffusion of metal atoms from the source electrode 13 toward the gate electrode 10 may be provided.

On top of the source electrode pad 15, a plating film 16 is selectively provided and at a surface side of the plating film 16, a solder 17 is selectively disposed. In the solder 17, a pin-shaped electrode (not depicted) that is an outlet wiring member that leads out potential of the source electrode 13 is provided. The pin-shaped electrode has a needle-like shape and is joined to the source electrode pad 15.

Figure 2:
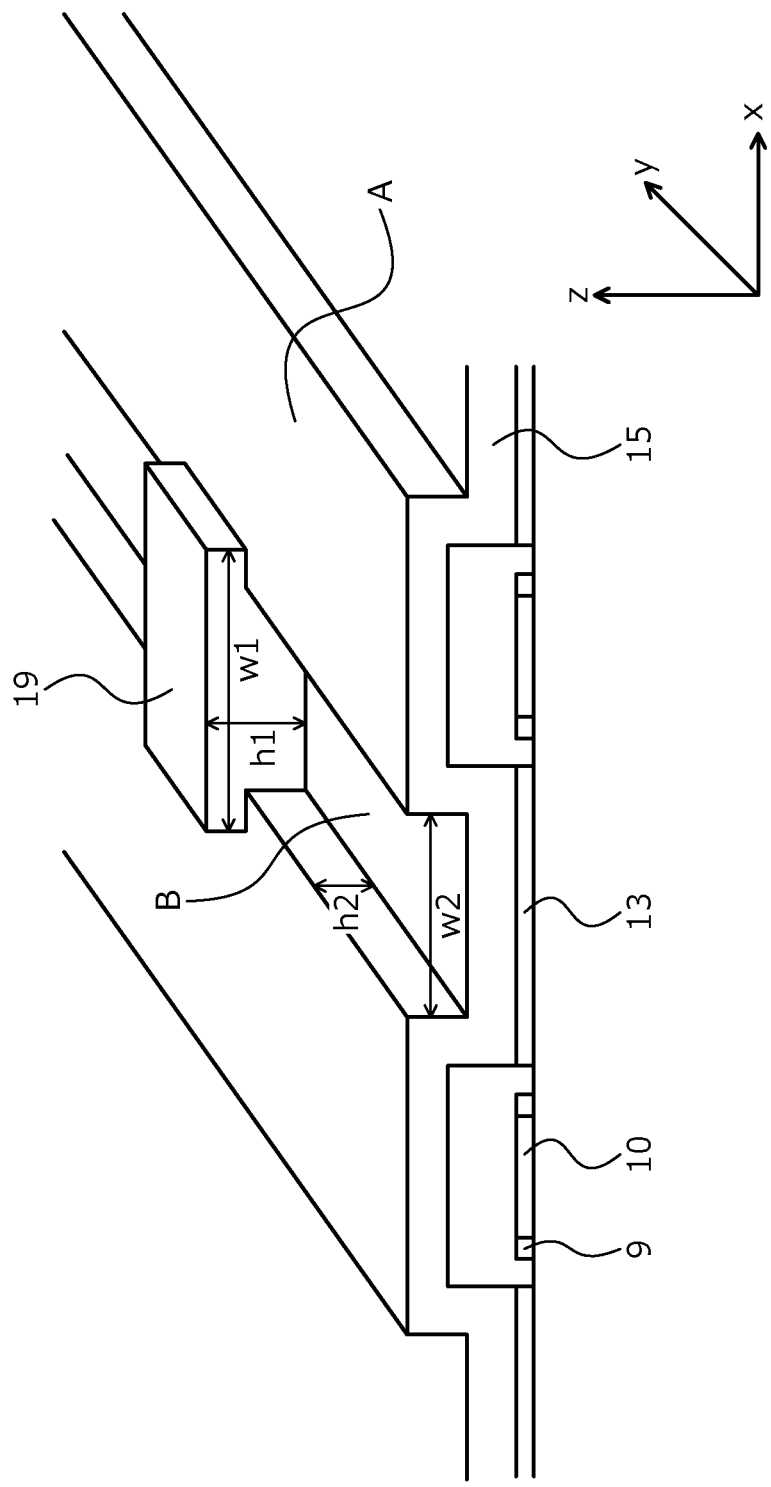
FIG. 2 is a perspective view of a part of the structure of the silicon carbide semiconductor device according to the first embodiment.

In the silicon carbide semiconductor device of the first embodiment, a step film 19 is provided in grooves B on the source electrode pad 15 on which the solder 17 and the plating film 16 is provided. FIG. 2 is a perspective view of a part of the structure of the silicon carbide semiconductor device according to the first embodiment. As depicted in FIG. 2, the step film 19 is selectively provided so as to be embedded in the grooves B on a top of the source electrode pad 15.

Figure 3:
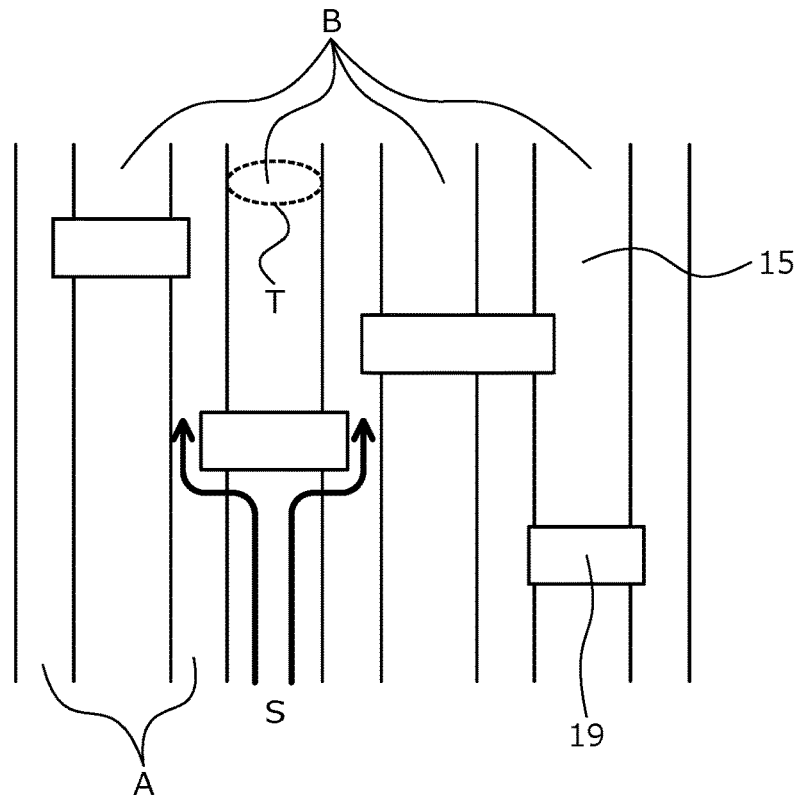
FIG. 3 is a top view of the structure of the silicon carbide semiconductor device according to the first embodiment.

FIG. 3 is a top view of the structure of the silicon carbide semiconductor device according to the first embodiment. As depicted in FIG. 3, at least one step film 19 is provided in each of the grooves B. The step film 19 inhibits flow of the solder 17 along the grooves B on the top of the source electrode pad 15. For example, as indicated by arrows S in FIG. 3, the solder 17 that flows along the grooves B, collides with the step film 19 and changes direction, distributing the flow. While the solder 17 conventionally flows in the grooves B, as depicted in FIG. 3, the solder 17 further flows in elevated parts A of the top of the source electrode pad 15, whereby the flow of the solder 17 is distributed. Distribution of the flow reduces the amount of the solder 17 that reaches ends T of the grooves B and thus, the pushing stress of the solder 17 is reduced, whereby the solder 17 may be prevented from entering inside the silicon carbide semiconductor device.

Further, the step film 19 has a function of an embankment that inhibits the flow of solder, as depicted in FIG. 2, the step film 19 may have a thickness h1 of a magnitude greater than that of a depth h2 of the grooves B. For example, the thickness h1 of the step film 19 may range from 0.9 μm to 1.1 μm. Further, the step film 19 may have a width w1 that is wider than a width w2 of the grooves B. When the width w1 of the step film 19 is too wide, the solder 17 that reaches the step film 19 does not turn at the sides but rather stays at the step film 19 and from this part, the solder 17 enters inside the silicon carbide semiconductor device. Therefore, for example, the width w1 of the step film 19 may be 10 μm or less. Further, the step film 19 has a longitudinal direction (x-axis direction) that is orthogonal to a longitudinal direction (y-axis direction) of the grooves B.

Figure 4:
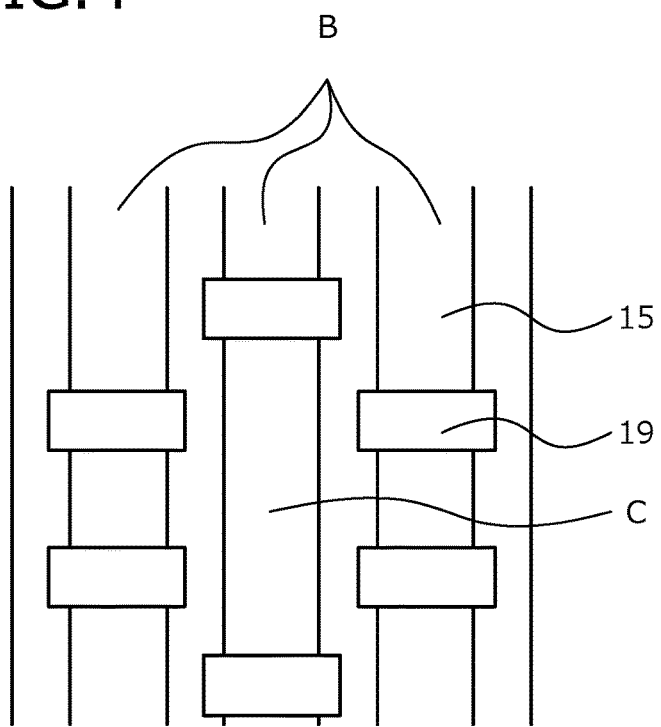
FIG. 4 is a top view of another structure of the silicon carbide semiconductor device according to the first embodiment.

Here, the step film 19 is provided in plural on the source electrode pad 15, at positions that may be regular or irregular provided that the flow of the solder 17 is distributed. For example, the step film 19 may be disposed in a ladder-shaped layout, crossed-shaped layout, square-shaped layout, etc. However, to efficiently distribute the flow of the solder 17, the solder 17 may be caused to flow radially. Therefore, the step film 19, in a plan view, may be disposed in a hexagonal-shaped layout. FIG. 4 is a top view of another structure of the silicon carbide semiconductor device according to the first embodiment. FIG. 4 depicts an example in which the step film 19 is disposed in a hexagonal-shaped layout. The step film 19 may be further disposed at a position corresponding to a center C of the hexagonal-shaped layout.

While the shape of the step film 19 is rectangular in FIGS. 3 and 4, the shape is not limited hereto. Provided that the flow of the solder 17 is distributed, another shape, for example, a hexagonal-shape, may be adopted.

A method of manufacturing a silicon carbide semiconductor device according to the first embodiment will be described. FIGS. 6, 7, 8, 9, 10, 11, and 12 are cross-sectional views of the silicon carbide semiconductor device according to the first embodiment during manufacture.

Figure 6:
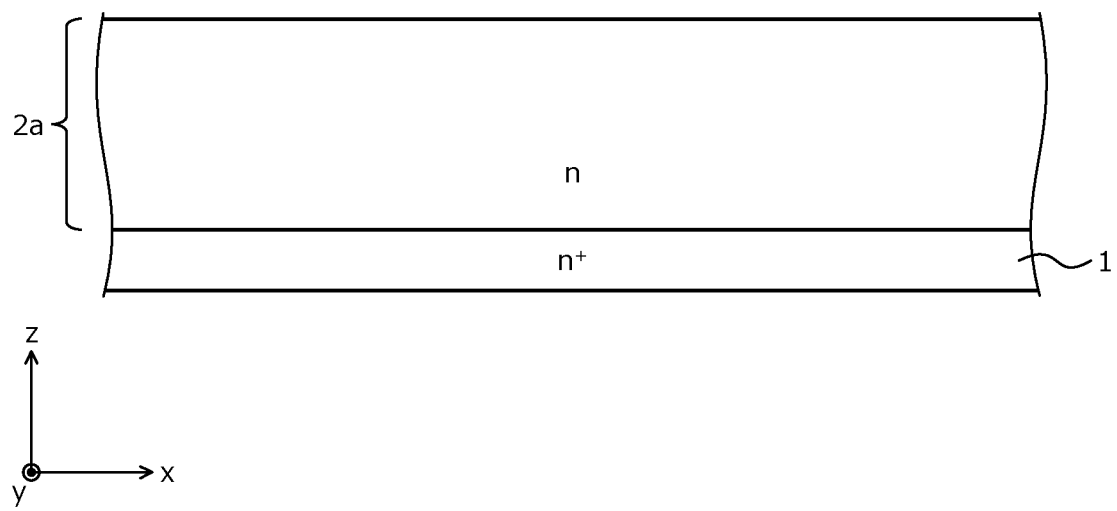
FIG. 6 is a cross-sectional view of the silicon carbide semiconductor device according to the first embodiment during manufacture.

First, the $n^+$-type silicon carbide substrate 1 containing an n-type silicon carbide is prepared. Subsequently, on the first main surface of the $n^+$-type silicon carbide substrate 1, a first n-type silicon carbide epitaxial layer 2a containing silicon carbide is formed by epitaxial growth to have a thickness of, for example, about 30 µm while an n-type impurity, for example, nitrogen atoms is doped. The first n-type silicon carbide epitaxial layer 2a constitutes the n-type silicon carbide epitaxial layer 2. The state up to here is depicted in FIG. 6.

Figure 7:
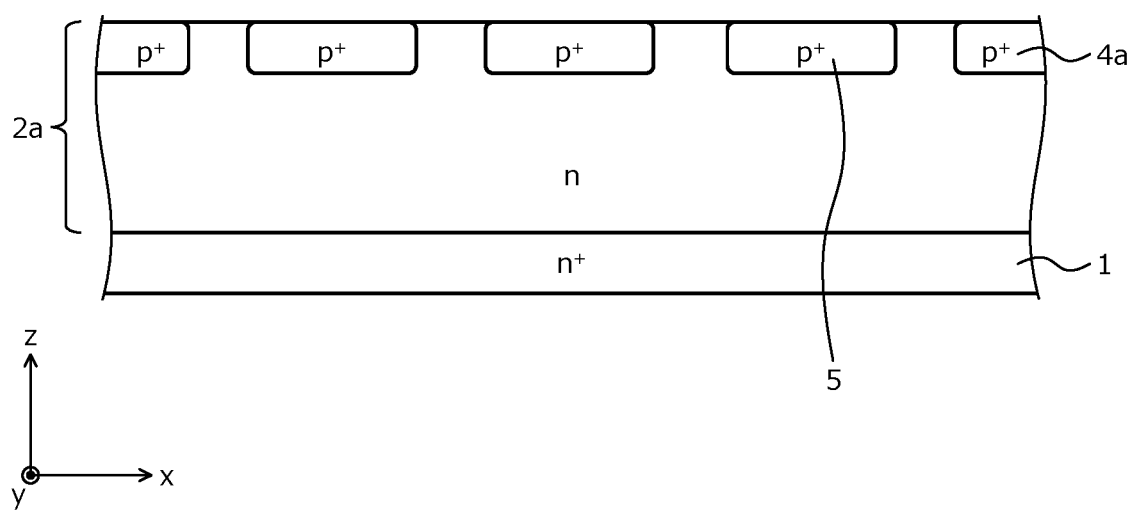
FIG. 7 is a cross-sectional view of the silicon carbide semiconductor device according to the first embodiment during manufacture.

Next, on a surface of the first n-type silicon carbide epitaxial layer 2a, by a photolithographic technique, an ion implantation mask having predetermined openings is formed using, for example, an oxide film. Subsequently, a p-type impurity such as aluminum is implanted in the openings of the oxide film, forming at a depth of about 0.5 µm, a lower first $p^+$-type base region 4a. Concurrently with the lower first $p^+$-type base region 4a, the second $p^+$-type base region 5 constituting the bottom of the trench 18 may be formed. Configuration is such that a distance between the lower first $p^+$-type base region 4a and the second $p^+$-type base region 5 that are adjacent to each other is about 1.5 µm. An impurity concentration of the lower first $p^+$-type base region 4a and of the second $p^+$-type base region 5 is set to be, for example, about $5\times10^{18}$/cm$^3$. The state up to here is depicted in FIG. 7.

Next, the ion implantation mask is partially removed, an n-type impurity such as nitrogen is ion implanted in the openings, forming in some surface regions of the first n-type silicon carbide epitaxial layer 2a, for example, at a depth of about 0.5 µm, a lower n-type high-concentration region 6a. An impurity concentration of the lower n-type high-concentration region 6a is set to be for example, about $1\times10^{17}$/cm$^3$.

Next, on the surface of the first n-type silicon carbide epitaxial layer 2a, a second n-type silicon carbide epitaxial layer 2b doped with an n-type impurity such as nitrogen is formed to have a thickness of about 0.5 µm. An impurity concentration of the second n-type silicon carbide epitaxial layer 2b is set to be about $3\times10^{15}$/cm$^3$. Hereinafter, the first n-type silicon carbide epitaxial layer 2a and the second n-type silicon carbide epitaxial layer 2b combined constitute the n-type silicon carbide epitaxial layer 2.

Next, on the surface of the second n-type silicon carbide epitaxial layer 2b, by photolithography, an ion implantation mask having predetermined openings is formed using, for example, an oxide film. Subsequently, a p-type impurity such as aluminum is implanted in the openings of the oxide film, forming at a depth of about 0.5 µm, an upper first p+-type base region 4b superimposed on the lower first $p^+$-type base region 4a. The lower first $p^+$-type base region 4a and the upper first p+-type base region 4b form a continuous region to constitute the first $p^+$-type base region 4. An impurity concentration of the upper first p+-type base region 4b is set to be, for example, about $5\times10^{18}$/cm$^3$.

Figure 8:
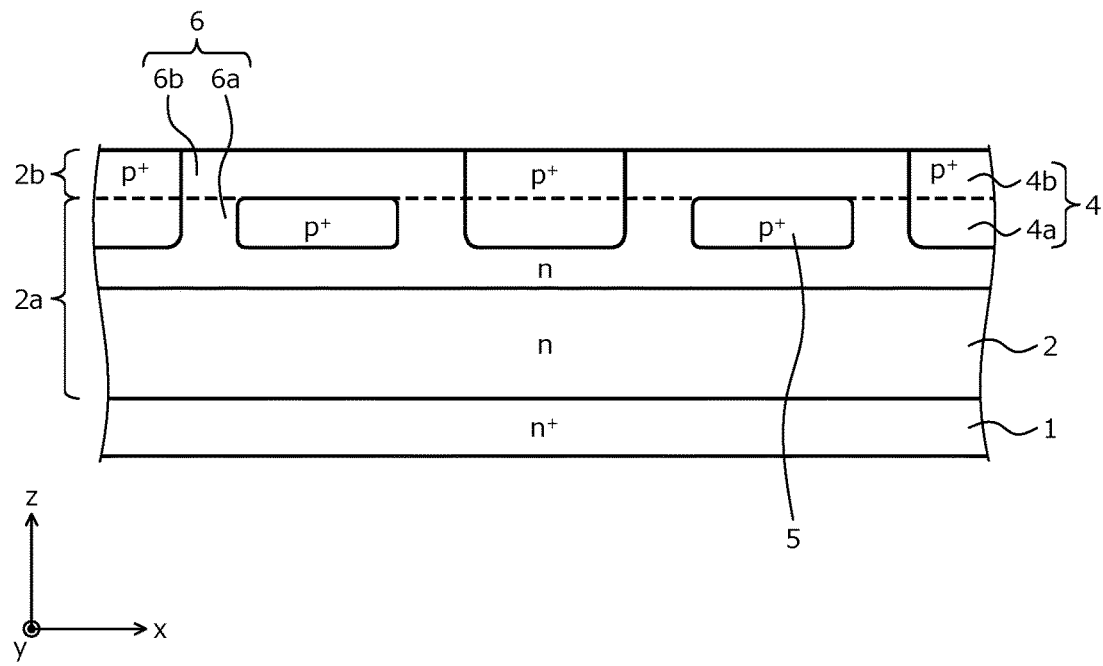
FIG. 8 is a cross-sectional view of the silicon carbide semiconductor device according to the first embodiment during manufacture.

Next, the ion implantation mask is partially removed, an n-type impurity such as nitrogen is ion implanted in the openings, forming at a depth of, for example, about 0.5 µm in some surface regions of the second n-type silicon carbide epitaxial layer 2b, an upper n-type high-concentration region 6b. An impurity concentration of the upper n-type high-concentration region 6b may be set to be, for example, about $1\times10^{17}$/cm$^3$. The upper n-type high-concentration region 6b and the lower n-type high-concentration region 6a are formed to at least partially contact each other and form the n-type high-concentration region 6. However, the n-type high-concentration region 6 may be formed on the entire substrate surface, or may be omitted. The state up to here is depicted in FIG. 8.

Figure 9:
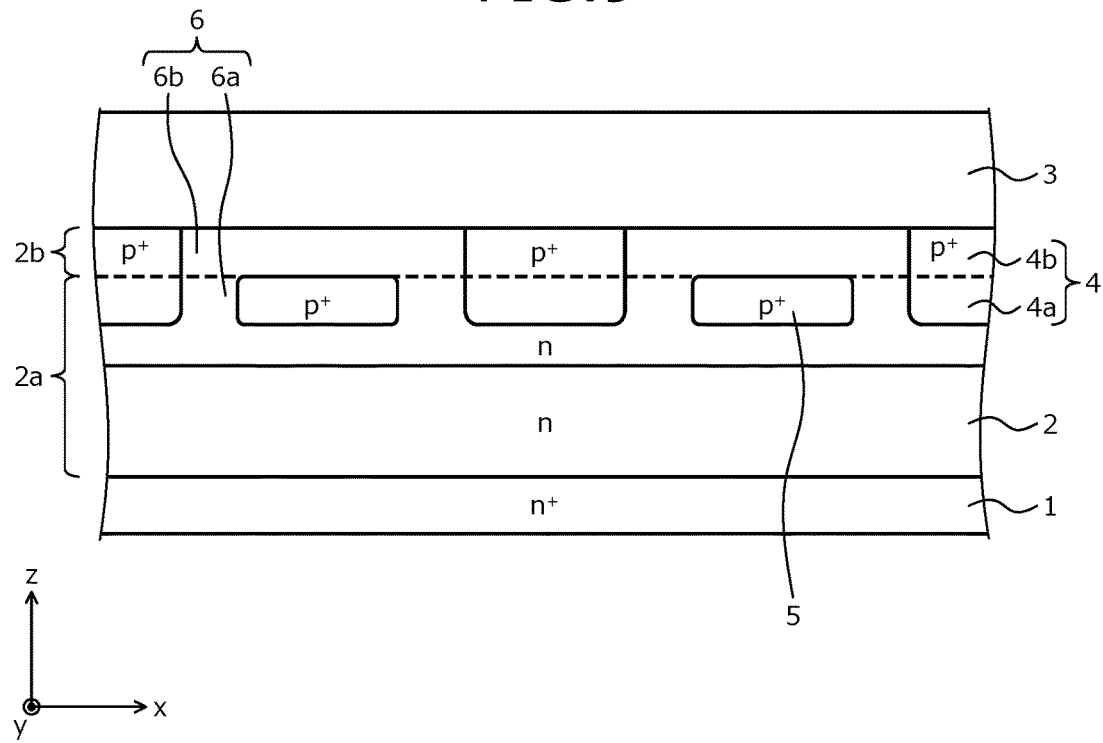
FIG. 9 is a cross-sectional view of the silicon carbide semiconductor device according to the first embodiment during manufacture.

Next, on the surface of the n-type silicon carbide epitaxial layer 2, the p-type silicon carbide epitaxial layer 3 doped with a p-type impurity such as aluminum is formed to have thickness of about 1.3 µm. An impurity concentration of the p-type silicon carbide epitaxial layer 3 is set to be about $4\times10^{17}$/cm$^3$. The state up to here is depicted in FIG. 9.

Figure 10:
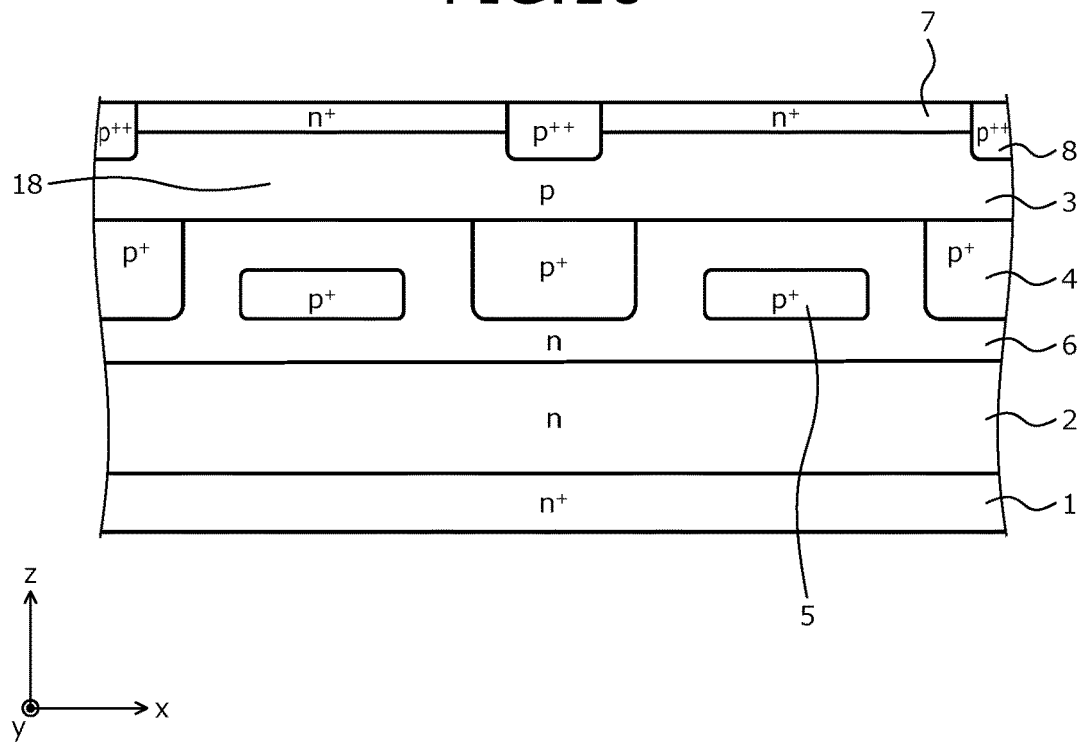
FIG. 10 is a cross-sectional view of the silicon carbide semiconductor device according to the first embodiment during manufacture.

Next, on the surface of the p-type silicon carbide epitaxial layer 3 and the surface of the exposed n-type silicon carbide epitaxial layer 2, an ion implantation mask having predetermined openings is formed by photolithography using, for example, an oxide film. An n-type impurity such as phosphorus (P) is ion implanted in the openings, forming the $n^+$-type source region 7 at parts of the surface of the p-type silicon carbide epitaxial layer 3. An impurity concentration of the $n^+$-type source region 7 is set to be higher than the impurity concentration of the p-type silicon carbide epitaxial layer 3. Next, the ion implantation mask used in the formation of the $n^+$-type source region 7 is removed and by a similar method, an ion implantation mask having predetermined openings is formed, a p-type impurity such as aluminum is ion implanted in parts of the surface of the p-type silicon carbide epitaxial layer 3, forming the $p^{++}$-type contact region 8. An impurity concentration of the $p^{++}$-type contact region 8 is set to be higher than the impurity concentration of the p-type silicon carbide epitaxial layer 3. The state up to here is depicted in FIG. 10.

Next, heat treatment (annealing) in an inert gas atmosphere of 1700 degrees C. is performed, whereby activation processing of the first $p^+$-type base region 4, the second $p^+$-type base region 5, the n-type high-concentration region 6, the $n^+$-type source region 7, and the $p^{++}$-type contact region 8 is performed. As described, ion implanted regions may be collectively activated by one session of heat treatment, or the heat treatment and activation may be performed each time ion implantation is performed.

Figure 11:
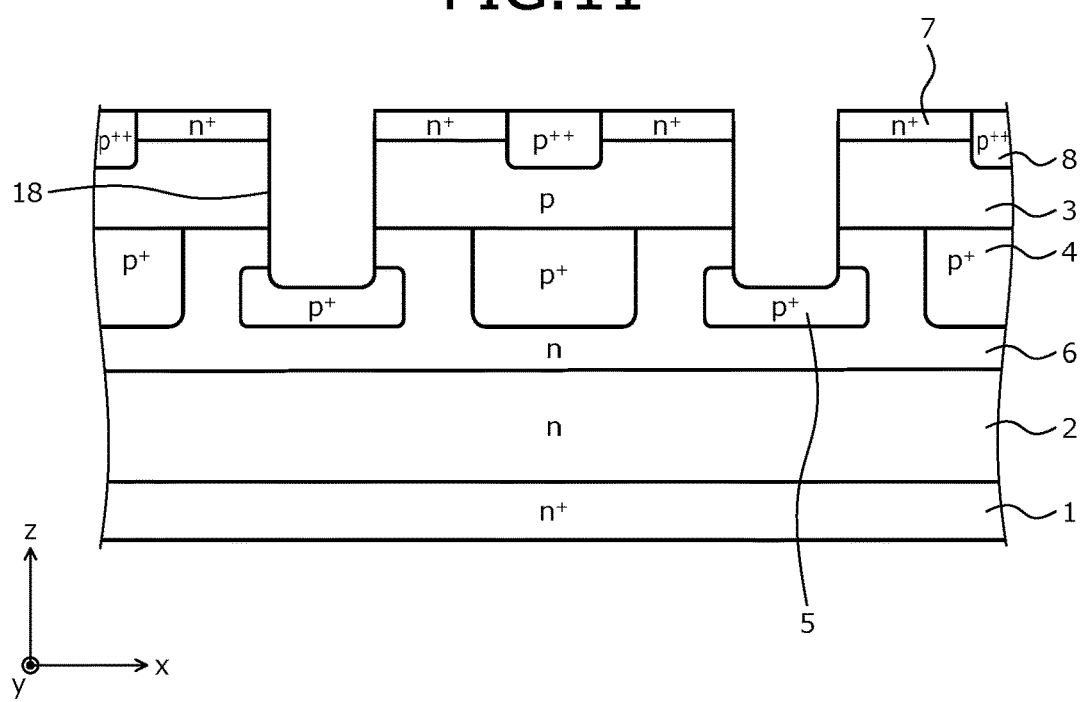
FIG. 11 is a cross-sectional view of the silicon carbide semiconductor device according to the first embodiment during manufacture.

Next, on the surface of the p-type silicon carbide epitaxial layer 3, by photolithography, a mask having predetermined openings and for forming the trench 18 is formed using, for example, an oxide film. Next, by dry etching, the trench 18 is formed penetrating the p-type silicon carbide epitaxial layer 3 and reaching the n-type silicon carbide epitaxial layer 2. The bottom of the trench 18 may reach the first $p^+$-type base region 4 formed in the n-type silicon carbide epitaxial layer 2. Next, the mask for forming the trench 18 is removed. The state up to here is depicted in FIG. 11.

Next, along the surfaces of the $n^+$-type source region 7 and the $p^{++}$-type contact region 8, and the bottom and the side walls of the trench 18, the gate insulating film 9 is formed. The gate insulating film 9 may be formed by thermal oxidation by heat treatment at a temperature of about 1000 degrees C. in an oxygen atmosphere. Further, the gate insulating film 9 may be formed by a method of deposition by a chemical reaction such as that for a high temperature oxide (HTO).

Next, on the gate insulating film 9, a polycrystalline silicon layer doped with, for example, phosphorus atoms is formed. The polycrystalline silicon layer may be formed so as to be embedded in the trench 18. The polycrystalline silicon layer is patterned by photolithography so as to remain in the trench 18, whereby the gate electrode 10 is formed. The gate electrode 10 may partially protrude out of the trench 18.

Figure 12:
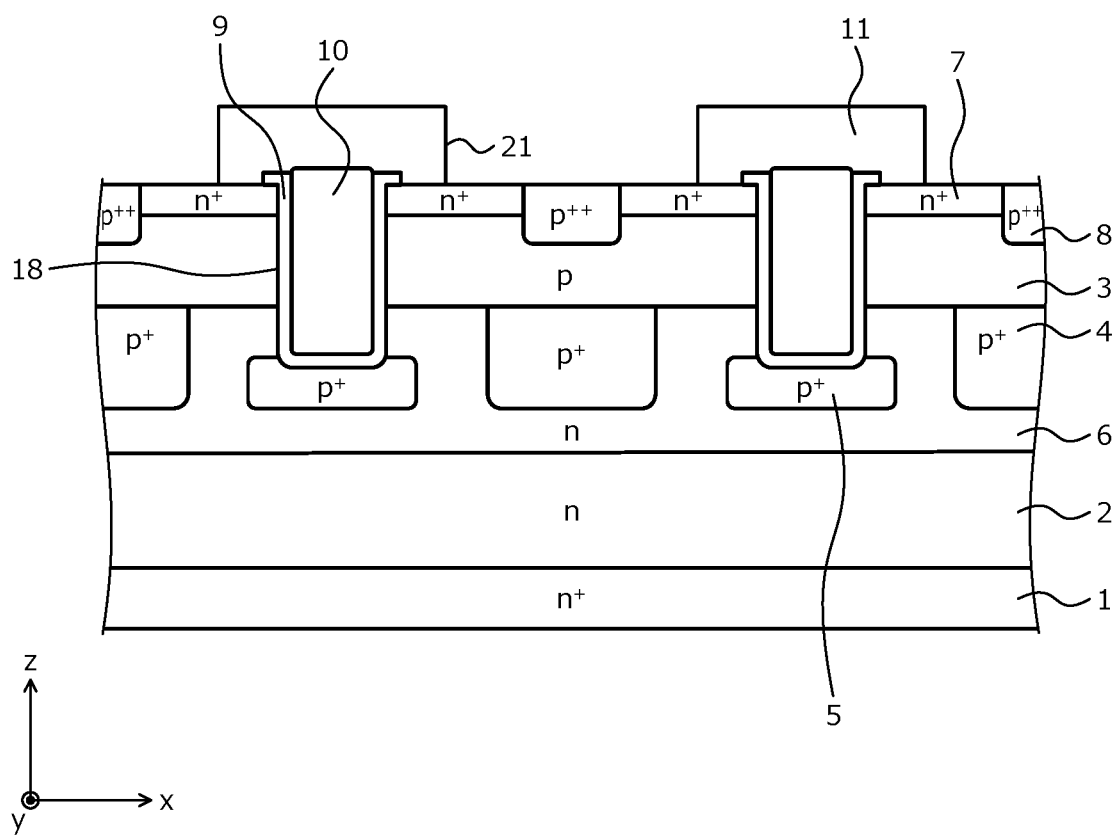
FIG. 12 is a cross-sectional view of the silicon carbide semiconductor device according to the first embodiment during manufacture.

Next, for example, phosphorus glass is deposited so as to cover the gate insulating film 9 and the gate electrode 10 and have a thickness of about 1 μm, whereby the interlayer insulating film 11 is formed. Next, a barrier metal (not depicted) containing titanium (Ti) or titanium nitride (TiN) may be provided so as to cover the interlayer insulating film 11. The interlayer insulating film 11 is patterned by photolithography, whereby a contact hole 21 exposing the $n^+$-type source region 7 and the $p^{++}$-type contact region 8 is formed. Here, the gate electrode has a striped shape and therefore, the contact hole 21 formed in the interlayer insulating film also has a striped shape. Thereafter, heat treatment (reflow) is performed, planarizing the interlayer insulating film 11. The state up to here is depicted in FIG. 12.

Next, in the contact hole 21 and on the interlayer insulating film 11, a conductive film of nickel (Ni), etc., constituting the source electrode 13 is formed. The conductive film is patterned by photolithography so that the source electrode 13 remains only in the contact hole 21.

Next, on the second main surface of the $n^+$-type silicon carbide semiconductor substrate 1, the rear electrode 14 containing nickel, etc. is provided. Thereafter, heat treatment is performed in an inert gas atmosphere of about 1000 degrees C., forming the source electrode 13 and the rear electrode 14 that form ohmic junctions with the $n^+$-type source region 7, the $p^{++}$-type contact region 8 and the $n^+$-type silicon carbide semiconductor substrate 1.

Next, on the first main surface of the $n^+$-type silicon carbide semiconductor substrate 1, by a sputtering method, an aluminum film having a thickness of about 5 μm is deposited and by photolithography, the aluminum film is removed so that the source electrode 13 and the interlayer insulating film 11 are covered, whereby the source electrode pad 15 is formed.

Next, on the source electrode pad 15, at a part where the plating film 16 is to be formed, a metal film is deposited by a sputtering method and by photolithography, the step films 19 are formed on the source electrode pad 15 on which the plating film 16 and the solder 17 are to be provided, the step films 19 are formed so as to be embedded in the grooves formed on the source electrode pad 15. Since the plating film 16 is formed on the step films 19, the step films 19 have to be a metal film and in particular, may be an aluminum-based metal similar to that of the source electrode pad 15.

Next, on the surface of the rear electrode 14, for example, titanium (Ti), nickel and gold (Au) are sequentially stacked in order stated, whereby the drain electrode pad (not depicted) is formed. Next, on top of the source electrode pad 15, the plating film 16 is selectively formed and on the plating film 16, via the solder 17, the pin-shaped electrode (not depicted) is formed. As described, the silicon carbide semiconductor device depicted in FIG. 1 is completed.

As described, according to the silicon carbide semiconductor device according to the first embodiment, the step film is provided in the grooves on the source electrode pad. The step film prevents solder from flowing along the grooves on top of the source electrode pad. As a result, the amount of solder that reaches the groove parts is reduced and the pushing stress of the solder is also reduced, whereby the solder may be prevented from entering inside the silicon carbide semiconductor device. Therefore, the silicon carbide semiconductor device is not susceptible to degradation of characteristics or decreases in reliability.

Figure 13:
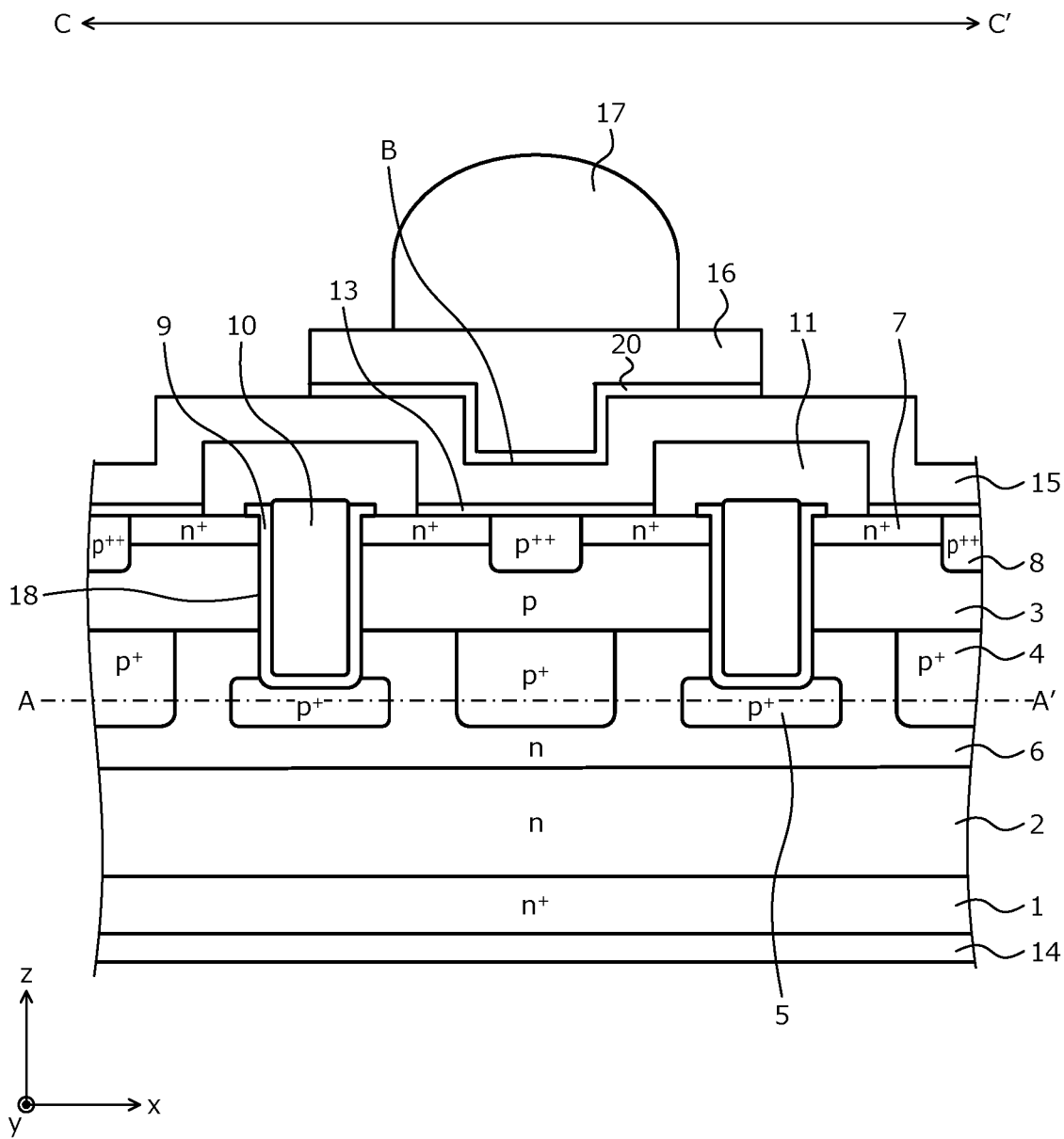
FIG. 13 is a cross-sectional view of a structure of the silicon carbide semiconductor device according to a second embodiment, at a part along a cutting line C-C' in FIG. 15.
Figure 14:
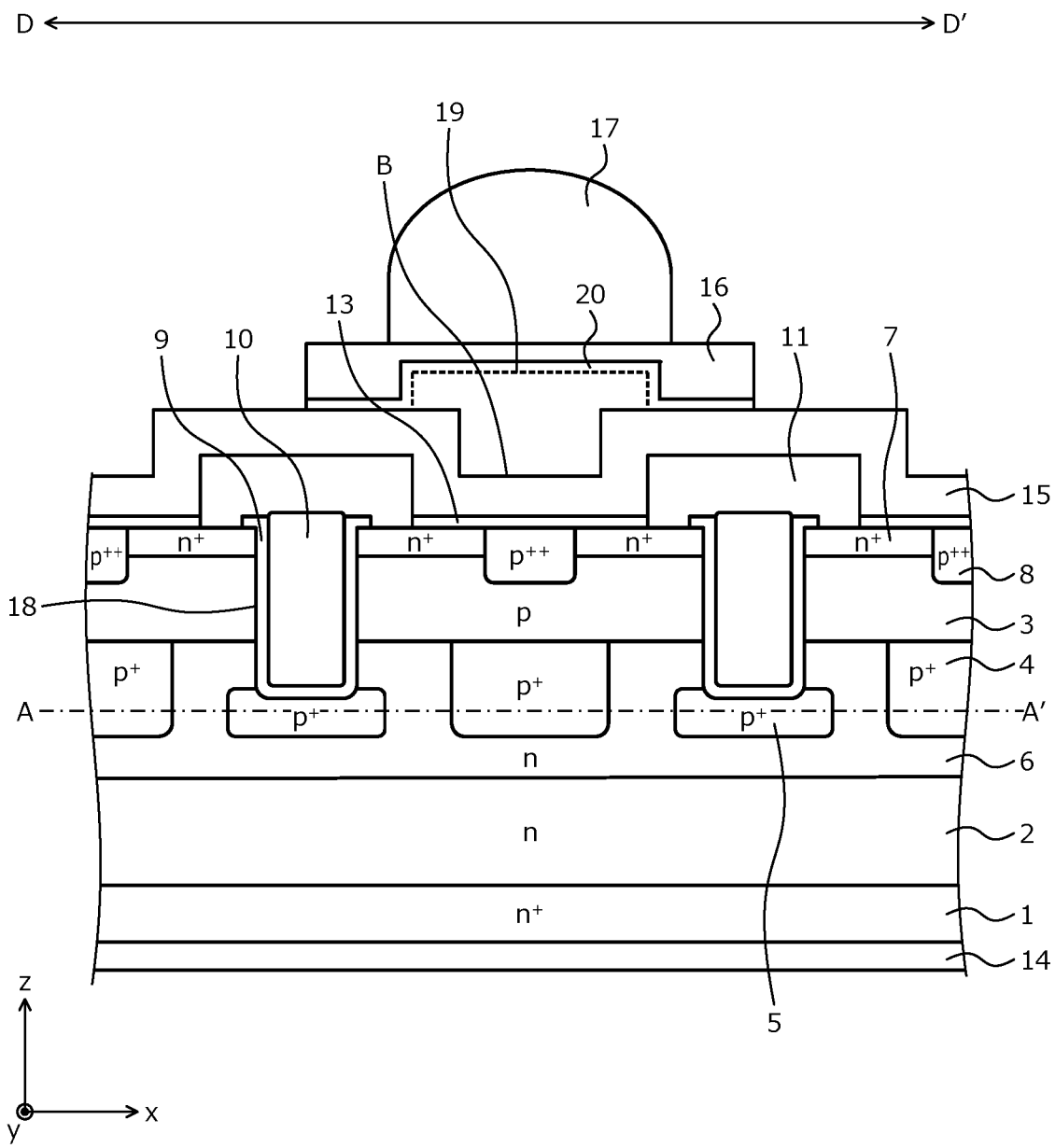
FIG. 14 is a cross-sectional view of the structure of the silicon carbide semiconductor device according to the second embodiment, at a part along a cutting line D-D' in FIG. 15.
Figure 15:
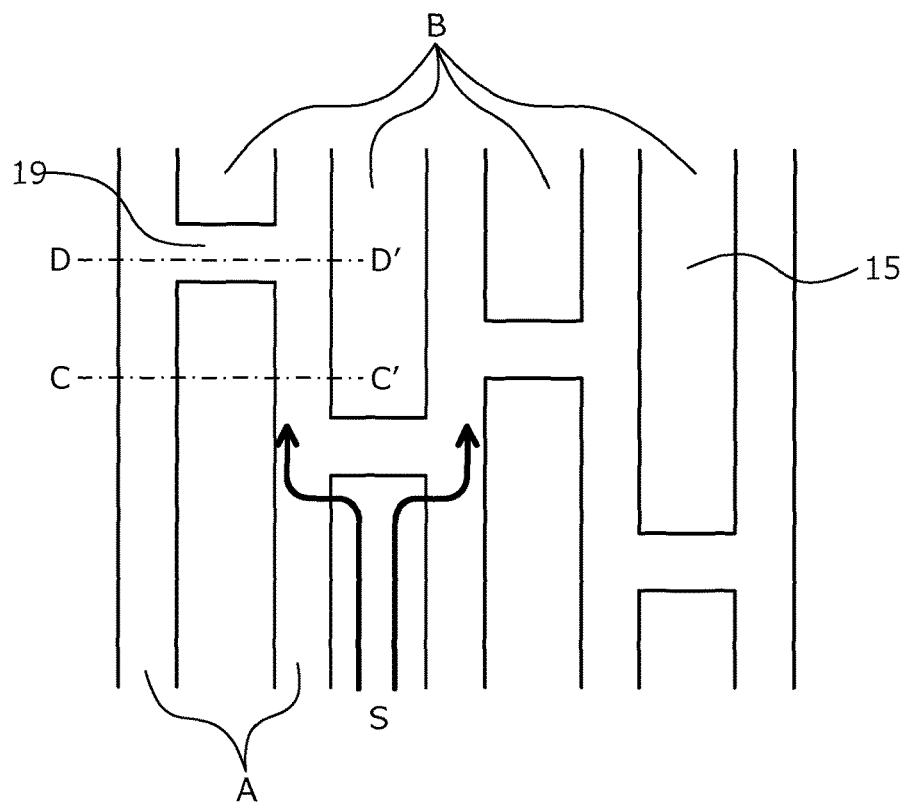
FIG. 15 is a top view of the structure of the silicon carbide semiconductor device according to the second embodiment.

FIG. 13 is a cross-sectional view of a structure of the silicon carbide semiconductor device according to a second embodiment, at a part along a cutting line C-C' in FIG. 15. FIG. 14 is a cross-sectional view of the structure of the silicon carbide semiconductor device according to the second embodiment, at a part along a cutting line D-D' in FIG. 15. The silicon carbide semiconductor device according to the second embodiment differs from the silicon carbide semiconductor device according to the first embodiment in that a metal film adjacent to the plating film 16 is provided, the metal film being sandwiched by the plating film 16 adjacent thereto and the source electrode pad 15 or the step film 19 adjacent thereto embedded in the groove B on the source electrode pad 15. Further, the step film 19 embedded in the grooves B is provided on the source electrode pad 15 on which the solder 17 and the plating film 16 is provided.

FIG. 13 depicts a metal film 20 when the step film 19 that is embedded in the grooves B on the source electrode pad 15 is not provided. FIG. 14 depicts the metal film 20 when the step film 19 that is embedded in the grooves B on the source electrode pad 15 is provided. FIG. 15 is a top view of a structure of the silicon carbide semiconductor device according to the second embodiment.

The step film 19 embedded in the grooves B on the source electrode pad 15, similarly to the first embodiment, inhibits the solder 17 from flowing along the groove B at the top of the source electrode pad 15. For example, the solder 17 that flows along the grooves B, as depicted in FIG. 15 by arrow S, collides with the step films 19 embedded in the grooves B and changes direction, distributing the flow. Therefore, similarly to the first embodiment, the solder 17 may be prevented from entering inside the silicon carbide semiconductor device.

Figure 16:
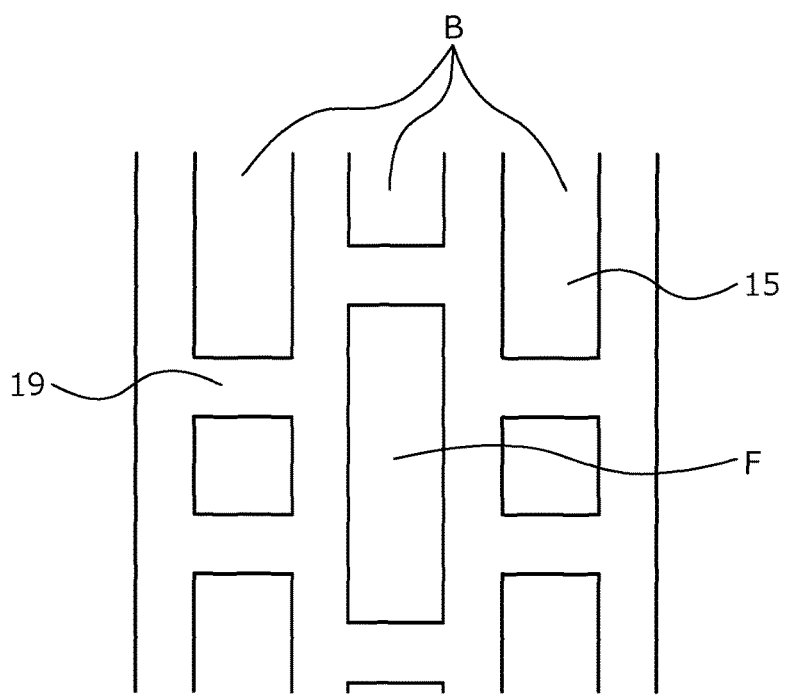
FIG. 16 is a top view of another structure the silicon carbide semiconductor device according to the second embodiment.

Further, the step film 19 embedded in the grooves B is disposed singularly or in plural in the grooves B on the source electrode pad 15 and positions of disposal may be regular or irregular, provided the flow of the solder 17 is distributed. For example, the step film 19 may be disposed in a ladder-shaped layout, a crossed-shaped layout, square-shaped layout, etc. However, to efficiently distribute the flow of the solder 17, the solder 17 may be caused to flow radially. Therefore, the step film 19 embedded in the grooves B, may be disposed in a hexagonal-shaped layout in a plan view. FIG. 16 is a top view of another structure the silicon carbide semiconductor device according to the second embodiment. FIG. 16 depicts an example in which the step film 19 embedded in the grooves B is disposed in a hexagonal-shaped layout. The step film 19 embedded in the grooves B may be further disposed at a position corresponding to a center F of the hexagonal-shaped layout.

While the shape of the step film 19 embedded in the grooves B is rectangular in FIGS. 15 and 16, the shape is not limited hereto. Provided that the flow of the solder 17 is distributed, another shape, for example, a hexagonal-shape may be adopted. In the present embodiment, the metal film 20 is provided adjacent to the plating film 16 to be sandwiched with the source electrode pad 15 or the step film 19 embedded in the grooves B on the source electrode pad 15. Therefore, adverse effects of the foundation when the plating film 16 is formed at a subsequent process may be eliminated.

A method of manufacturing a silicon carbide semiconductor device according to the second embodiment will be described. First, similarly to the first embodiment, the process from forming the n-type silicon carbide epitaxial layer 2 to the process of forming the source electrode pad 15 and the rear electrode 14 are sequentially performed.

Next, on the surface of the source electrode pad 15, the step film 19 is formed. At this time, on the source electrode 13 above which the plating film 16 is formed, the step film 19 is formed so as to be partially embedded in the groove B and to have at parts, a thickness that is substantially equal to a thickness of the interlayer insulating film 11. Thereafter, similarly to the first embodiment, the metal film 20 is formed. In the present embodiment, the metal film 20 is formed on the step films 19, enabling use as the step films 19 and an insulating film, not just as a metal film. Next, on the surface of the source electrode pad 15 and the surfaces of the step films 19, the metal film 20 is formed. While a material of the metal film 20 is not limited, the material may be the same material as that of the source electrode pad 15.

Next, on the surface of the rear electrode 14, for example, titanium (Ti), nickel and gold (Au) are sequentially stacked, forming the drain electrode pad (not depicted). Next, on top of the metal film 20, the plating film 16 is selectively formed and on the plating film 16, via the solder 17, the pin-shaped electrode (not depicted) is formed. As described, the silicon carbide semiconductor device depicted in FIGS. 13 and 14 is completed.

As described, according to the silicon carbide semiconductor device according to the second embodiment, the step film is provided in the grooves on the source electrode pad. Due to the step film embedded in the grooves, the second embodiment achieves effects similar to those of the first embodiment. Further, in the second embodiment, between step film and the plating film, a metal film is provided, whereby the foundation of the plating film may be entirely the same material, enabling the plating film to be formed uniformly.

In the embodiments of the present invention, while a case in which a main surface of a silicon carbide substrate containing silicon carbide is a (0001) plane and a MOS is formed on the (0001) plane has been described as an example, without limitation hereto, various modifications are possible such as in the wide bandgap semiconductor material, orientation of the substrate surface, etc.

Further, in the embodiments of the present invention, while a trench-type MOSFET has been described as an example, without limitation hereto, the present invention is applicable to semiconductor devices of various configurations such as a MOS-type semiconductor device such as an IGBT, a planar-type MOSFET having a striped-shape gate electrode, etc. In the embodiments, while a case in which silicon carbide is used as the wide bandgap semiconductor material, when a wide bandgap semiconductor material other than silicon carbide such as gallium nitride (GaN) is used, similar effects are obtained. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the embodiments of the present invention, a step film is provided in the grooves on the source electrode pad. The step film prevents solder from flowing along the grooves on top of the source electrode pad. As a result, the amount of solder that reaches the groove part is reduced and the pushing stress of the solder is reduced, whereby the solder may be prevented from entering inside the silicon carbide semiconductor device. Therefore, the silicon carbide semiconductor device is not susceptible to degradation of characteristics or decreases in reliability.

The silicon carbide semiconductor device and method of manufacturing a silicon carbide semiconductor device according to the embodiments of the present invention achieve an effect in that solder is prevented from reaching the surface of the silicon carbide base and the silicon carbide semiconductor device is not susceptible to degradation of characteristics or decreases in reliability.

As described, the silicon carbide semiconductor device and the method of manufacturing a silicon carbide semiconductor device according to the embodiments of the present invention are useful for high-voltage semiconductor devices used in power converting equipment and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate of a first conductivity type;
   a first semiconductor layer of the first conductivity type provided on a front surface of the semiconductor substrate and having an impurity concentration that is lower than an impurity concentration of the semiconductor substrate;
   a second semiconductor layer of a second conductivity type selectively provided on a surface of the first semiconductor layer on a first side of the first semiconductor layer, opposite a second side of the first semiconductor layer facing toward the semiconductor substrate;
   a first semiconductor region of the first conductivity type selectively provided in a surface layer of the second semiconductor layer on a first side of the second semiconductor layer, opposite a second side of the second semiconductor layer facing toward the semiconductor substrate;
   a first gate electrode having a striped-shape and provided on the first side of the second semiconductor layer, via a first gate insulating film;
   a second gate electrode, adjacent to the first gate electrode, having the striped-shape and provided on the first side of the second semiconductor layer, via a second gate insulating film;
   a first interlayer insulating film that covers the first gate electrode;
   a second interlayer insulating film that covers the second gate electrode;
   a contact hole having a striped-shape and provided between the first interlayer insulating film and the second interlayer insulating film;
   a first electrode provided in the contact hole on a surface of the first semiconductor region and the second semiconductor layer;
   an electrode pad provided on at least a portion of the first interlayer insulating film, on at least a portion of the second interlayer insulating film, and on the first electrode in the contact hole, such that a groove is formed in an upper surface of the electrode pad at a position where the electrode pad is provided on the first electrode in the contact hole;
a step film embedded in the groove;
a plating film selectively provided on a first side of the step film, opposite a second side of the step film facing toward the semiconductor substrate;
a solder provided on the plating film; and
a second electrode provided on a rear surface of the semiconductor substrate,
wherein
a width of the step film is greater than a width of the groove, and
the width of the step film is less than a distance between the first gate electrode and the second gate electrode.

2. The silicon carbide semiconductor device according to claim 1, wherein a plurality of step films are disposed in a layout having a hexagonal-shape in a plan view.

3. The silicon carbide semiconductor device according to claim 1, wherein the step film has a thickness ranging from 0.9 μm to 1.1 μm and a width that is at most 10 μm.

4. The silicon carbide semiconductor device according to claim 1, further comprising a metal film sandwiched between the plating film and the first electrode and between the plating film and the step film.

5. The silicon carbide semiconductor device according to claim 1, wherein the step film is made of a metal.

6. The silicon carbide semiconductor device according to claim 1, wherein the first side of the step film is in direct contact with the plating film and the second side of the step film is in direct contact with the electrode pad.

7. The silicon carbide semiconductor device according to claim 1, further comprising
a trench penetrating the second semiconductor layer and reaching the first semiconductor layer, wherein
the gate electrode is provided in the trench, via the gate insulating film.

8. The silicon carbide semiconductor device according to claim 1, wherein the step film is embedded in the groove formed in the upper surface of the electrode pad, between the electrode pad and the plating film, to inhibit or change a direction of a flow of the solder along the groove, when the solder is provided on the plating film.

9. The silicon carbide semiconductor device according to claim 1, wherein
the step film includes a first end on a first side of the groove adjacent to the first gate electrode and a second end on a second side of the groove adjacent to the second gate electrode.

10. The silicon carbide semiconductor device according to claim 1, further comprising another step film embedded in the groove formed in the upper surface of the electrode pad at a location spaced apart from the step film in a longitudinal direction of the groove.

11. The silicon carbide semiconductor device according to claim 1, further comprising:
a third gate electrode, adjacent to the second gate electrode, having the striped-shape and provided on the first side of the second semiconductor layer, via a third gate insulating film;
a third interlayer insulating film that covers the third gate electrode;
another contact hole having a striped-shape and provided between the second interlayer insulating film and the third interlayer insulating film;
another electrode provided in the another contact hole on a surface of the first semiconductor region and the second semiconductor layer; and
another step film embedded in another groove formed in the upper surface of the electrode pad at a position where the electrode pad is provided on the another electrode in the another contact hole, the another step film being spaced apart from the step film in a width direction of the groove, which is perpendicular to a longitudinal direction of the groove and a depth direction of the groove.

12. The silicon carbide semiconductor device according to claim 1, wherein
the step film is formed of an aluminum-based metal and is formed of a same material as the electrode pad,
the first electrode includes a conductive film of nickel, and,
a central portion of the step film has a thickness greater than a depth of the groove.

13. The silicon carbide semiconductor device according to claim 1, further comprising:
a second semiconductor region of the second conductivity type selectively provided in the surface layer of the second semiconductor layer on the first side of the second semiconductor layer, opposite the second side of the second semiconductor layer facing toward the semiconductor substrate, the second semiconductor region having an impurity concentration that is higher than an impurity concentration of the second semiconductor layer,
wherein
the step film includes a first portion disposed inside the groove directly above the second semiconductor region, a second portion disposed outside of the groove on one side of the first portion, and a third portion disposed outside of the groove on another side of the first portion, and
the first side of the step film at the first portion, the first side of the step film at the second portion, and the first side of the step film at the third portion, are coplanar with each other.

14. The silicon carbide semiconductor device according to claim 13, wherein
a distance from the first side of the step film to the second side of the step film at a position corresponding to the first portion is greater than a distance from the first side of the step film to the second side of the step film at a position corresponding to the second portion, and
the distance from the first side of the step film to the second side of the step film at a position corresponding to the second portion is the same as a distance from the first side of the step film to the second side of the step film at a position corresponding to the third portion.

15. The silicon carbide semiconductor device according to claim 1, wherein the step film is partially embedded in the groove in an area where the plating film is provided.

16. A silicon carbide semiconductor device, comprising:
a semiconductor substrate of a first conductivity type;
a first semiconductor layer of the first conductivity type provided on a front surface of the semiconductor substrate and having an impurity concentration that is lower than an impurity concentration of the semiconductor substrate;
a second semiconductor layer of a second conductivity type selectively provided on a surface of the first semiconductor layer on a first side of the first semiconductor layer, opposite a second side of the first semiconductor layer facing toward the semiconductor substrate;
a first semiconductor region of the first conductivity type selectively provided in a surface layer of the second semiconductor layer on a first side of the second semiconductor layer, opposite a second side of the second semiconductor layer facing toward the semiconductor substrate;
a first gate electrode having a striped-shape and provided on the first side of the second semiconductor layer, via a first gate insulating film;
a second gate electrode, adjacent to the first gate electrode, having the striped-shape and provided on the first side of the second semiconductor layer, via a second gate insulating film;
a first interlayer insulating film that covers the first gate electrode;
a second interlayer insulating film that covers the second gate electrode;
a contact hole having a striped-shape and provided between the first interlayer insulating film and the second interlayer insulating film;
a first electrode provided in the contact hole on a surface of the first semiconductor region and the second semiconductor layer;
an electrode pad provided on at least a portion of the first interlayer insulating film, on at least a portion of the second interlayer insulating film, and on the first electrode in the contact hole, such that a groove is formed in an upper surface of the electrode pad at a position where the electrode pad is provided on the first electrode in the contact hole;
a step film embedded in the groove;
a plating film selectively provided on a first side of the step film, opposite a second side of the step film facing toward the semiconductor substrate;
a solder provided on the plating film; and
a second electrode provided on a rear surface of the semiconductor substrate,
wherein
the step film is formed of an aluminum-based metal and is formed of a same material as the electrode pad,
the first electrode includes a conductive film of nickel, and,
a central portion of the step film has a thickness greater than a depth of the groove.

17. A silicon carbide semiconductor device, comprising:
a semiconductor substrate of a first conductivity type;
a first semiconductor layer of the first conductivity type provided on a front surface of the semiconductor substrate and having an impurity concentration that is lower than an impurity concentration of the semiconductor substrate;
a second semiconductor layer of a second conductivity type selectively provided on a surface of the first semiconductor layer on a first side of the first semiconductor layer, opposite a second side of the first semiconductor layer facing toward the semiconductor substrate;
a first semiconductor region of the first conductivity type selectively provided in a surface layer of the second semiconductor layer on a first side of the second semiconductor layer, opposite a second side of the second semiconductor layer facing toward the semiconductor substrate;
a first gate electrode having a striped-shape and provided on the first side of the second semiconductor layer, via a first gate insulating film;
a second gate electrode, adjacent to the first gate electrode, having the striped-shape and provided on the first side of the second semiconductor layer, via a second gate insulating film;
a first interlayer insulating film that covers the first gate electrode;
a second interlayer insulating film that covers the second gate electrode;
a contact hole having a striped-shape and provided between the first interlayer insulating film and the second interlayer insulating film;
a first electrode provided in the contact hole on a surface of the first semiconductor region and the second semiconductor layer;
an electrode pad provided on at least a portion of the first interlayer insulating film, on at least a portion of the second interlayer insulating film, and on the first electrode in the contact hole, such that a groove is formed in an upper surface of the electrode pad at a position where the electrode pad is provided on the first electrode in the contact hole;
a step film embedded in the groove;
a plating film selectively provided on a first side of the step film, opposite a second side of the step film facing toward the semiconductor substrate;
a solder provided on the plating film;
a second electrode provided on a rear surface of the semiconductor substrate;
a second semiconductor region of the second conductivity type selectively provided in the surface layer of the second semiconductor layer on the first side of the second semiconductor layer, opposite the second side of the second semiconductor layer facing toward the semiconductor substrate, the second semiconductor region having an impurity concentration that is higher than an impurity concentration of the second semiconductor layer,
wherein
the step film includes a first portion disposed inside the groove directly above the second semiconductor region, a second portion disposed outside of the groove on one side of the first portion, and a third portion disposed outside of the groove on another side of the first portion, and
the first side of the step film at the first portion, the first side of the step film at the second portion, and the first side of the step film at the third portion, are coplanar with each other.

18. The silicon carbide semiconductor device according to claim 17, wherein
a distance from the first side of the step film to the second side of the step film at a position corresponding to the first portion is greater than a distance from the first side of the step film to the second side of the step film at a position corresponding to the second portion, and
the distance from the first side of the step film to the second side of the step film at a position corresponding to the second portion is the same as a distance from the first side of the step film to the second side of the step film at a position corresponding to the third portion.

* * * * *